United States Patent
Lammers et al.

(10) Patent No.: US 9,563,137 B2
(45) Date of Patent: Feb. 7, 2017

(54) LITHOGRAPHIC APPARATUS AND DEVICE MANUFACTURING METHOD

(75) Inventors: Nicolaas Arnoldus Lammers, Sittard (NL); Luigi Scaccabarozzi, Valkenswaard (NL)

(73) Assignee: ASML NETHERLANDS B.V., Veldhoven (NL)

( * ) Notice: Subject to any disclaimer, the term of this patent is extended or adjusted under 35 U.S.C. 154(b) by 880 days.

(21) Appl. No.: 13/378,928

(22) PCT Filed: May 20, 2010

(86) PCT No.: PCT/EP2010/057008
§ 371 (c)(1),
(2), (4) Date: Dec. 16, 2011

(87) PCT Pub. No.: WO2010/149438
PCT Pub. Date: Dec. 29, 2010

(65) Prior Publication Data
US 2012/0086929 A1    Apr. 12, 2012

Related U.S. Application Data

(60) Provisional application No. 61/219,618, filed on Jun. 23, 2009.

(51) Int. Cl.
*G03B 27/42*    (2006.01)
*G03F 7/20*     (2006.01)
(Continued)

(52) U.S. Cl.
CPC ............ *G03F 7/70925* (2013.01); *B08B 5/02* (2013.01); *B08B 7/0042* (2013.01); *G03F 7/708* (2013.01); *H01L 21/02046* (2013.01)

(58) Field of Classification Search
CPC ............ B08B 5/02; B08B 3/02; B08B 5/023; B08B 5/026; B08B 3/024; B08B 5/04; B08B 7/00; B08B 6/00; B08B 7/0042; B08B 7/02; B08B 9/093; B08B 11/00; H01J 37/32009; H01J 37/32449; H01J 37/32871; H01J 37/32357; H01J 37/32422; H01J 37/3244; B23K 26/0648; B23K 26/362; B23K 2203/30
(Continued)

(56) References Cited

U.S. PATENT DOCUMENTS 5,023,424 A    6/1991 Vaught
5,669,979 A *  9/1997 Elliott et al. .............. 134/1
(Continued)

FOREIGN PATENT DOCUMENTS

CN    1430243 A    7/2003
EP    1329773 A2   7/2003
(Continued)

OTHER PUBLICATIONS

International Search Report for PCT International Patent Application No. PCT/EP2010/057008, mailed Aug. 10, 2010.

*Primary Examiner* — Mesfin Asfaw
(74) *Attorney, Agent, or Firm* — Pillsbury Winthrop Shaw Pittman LLP

(57) ABSTRACT

A lithographic projection apparatus includes a laser cleaning device. The laser cleaning device is constructed and arranged to clean a surface. The laser cleaning device includes a laser source constructed and arranged to generate radiation, and an optical element constructed and arranged to focus the radiation in a focal point in order to generate a cleaning plasma in a background gas above the surface. The laser cleaning device is further provided with a gas supply constructed and arranged to generate a jet of protection gas at a location near the plasma.

18 Claims, 4 Drawing Sheets

(51) Int. Cl.
    *B08B 5/02*           (2006.01)
    *B08B 7/00*           (2006.01)
    *H01L 21/02*          (2006.01)

(58) Field of Classification Search
    USPC .................................. 355/53, 55, 63, 67, 77
    See application file for complete search history.

(56) References Cited

U.S. PATENT DOCUMENTS

| | | |
|---|---|---|
| 5,800,625 A | 9/1998 | Engelsberg et al. |
| 6,635,844 B2 | 10/2003 | Yu |
| 6,635,845 B2 * | 10/2003 | Lee et al. .................. 219/121.68 |
| 6,856,376 B2 | 2/2005 | Heerens et al. |
| 2002/0170892 A1 | 11/2002 | Lee et al. |
| 2004/0182416 A1 | 9/2004 | Allen et al. |
| 2007/0163715 A1 | 7/2007 | Rastegar |

FOREIGN PATENT DOCUMENTS

| | | |
|---|---|---|
| JP | 4-211127 | 8/1992 |
| JP | 2000-515811 | 11/2000 |
| JP | 2002-343761 A | 11/2002 |
| JP | 2003-7655 | 1/2003 |
| JP | 2003-224067 | 8/2003 |
| JP | 2003-303800 | 10/2003 |
| JP | 2006-108696 | 4/2006 |
| KR | 2002-0088661 A | 11/2002 |
| WO | 98/04366 A1 | 2/1998 |

\* cited by examiner

LITHOGRAPHIC APPARATUS AND DEVICE MANUFACTURING METHOD

CROSS-REFERENCE TO RELATED APPLICATIONS

This application is the U.S. National Phase entry of PCT/EP2010/057008, filed May 20, 2010, which claims the benefit of U.S. provisional application No. 61/219,618 which was filed on Jun. 23, 2009, both of which are incorporated herein in their entireties by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

A property of EUV radiation is that all known materials are highly opaque to EUV radiation. As a consequence, reflective elements instead of lenses are used in any optical systems of the lithographic projection apparatus. For this reason, the patterning device is typically also reflective instead of transmissive.

A transmissive optical element that cannot easily be replaced by a reflective one when using EUV radiation, is a pellicle. Pellicles are known in the art, for instance from United States Patent Application Publication No. US2005/0280789. Contamination deposits on the pellicle, while radiation transmits through the pellicle. Since the pellicle is located at a certain predetermined distance from the patterning device, the contamination will be out-of-focus and thus will not be projected onto the target portion of the substrate. Because the transmissivity of the pellicle to the radiation that is to be patterned contributes to the proper functioning of the pellicle, a pellicle cannot be used when EUV is being used. Therefore, a pellicle does not provide acceptable solution to contamination deposition on the patterning device.

SUMMARY

It is desirable to provide an alternative to the use of a pellicle that is also suitable to be applied when EUV is being used as the radiation that is to be patterned.

According to an aspect of the invention, there is provided a lithographic projection apparatus that includes a laser cleaning device constructed and arranged to clean a surface. The laser cleaning device includes a laser source constructed and arranged to generate radiation and an optical element constructed and arranged to focus the radiation in a focal point in order to generate a cleaning plasma in a background gas above the surface. The laser cleaning device is further provided with a gas supply constructed and arranged to generate a jet of protection gas at a location near the plasma.

According to an aspect of the invention, there is provided a laser cleaning device constructed and arranged to clean a surface. The laser cleaning device includes a laser source constructed and arranged to generate radiation and an optical element constructed and arranged to focus the radiation in a focal point in order to generate a plasma in a background gas above the surface. The laser cleaning device is further provided with a gas supply constructed and arranged to generate a jet of protection gas at a location near the plasma.

According to an aspect of the invention, there is provided a method for cleaning a surface. The method includes generating radiation, focusing the radiation in a focal point in order to generate a cleaning plasma in a background gas, and directing a jet of protection gas to a location near the plasma.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
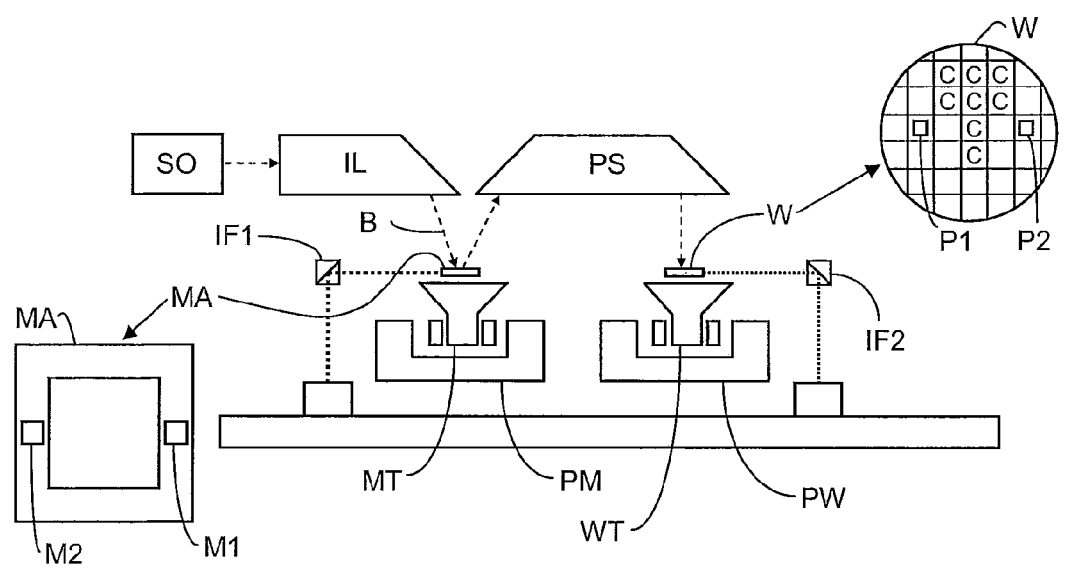
FIG. 1 depicts a lithographic apparatus comprising a laser cleaning device.

FIG. 1 schematically depicts a lithographic apparatus according to one embodiment of the invention. The apparatus includes an illumination system (illuminator) IL configured to condition a radiation beam B (e.g. EUV radiation), a support structure (e.g. a mask table) MT constructed to support a patterning device (e.g. a mask or a reticle) MA and connected to a first positioner PM configured to accurately position the patterning device, a substrate table (e.g. a wafer table) WT constructed to hold a substrate (e.g. a resist-coated wafer) W and connected to a second positioner PW configured to accurately position the substrate, and a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
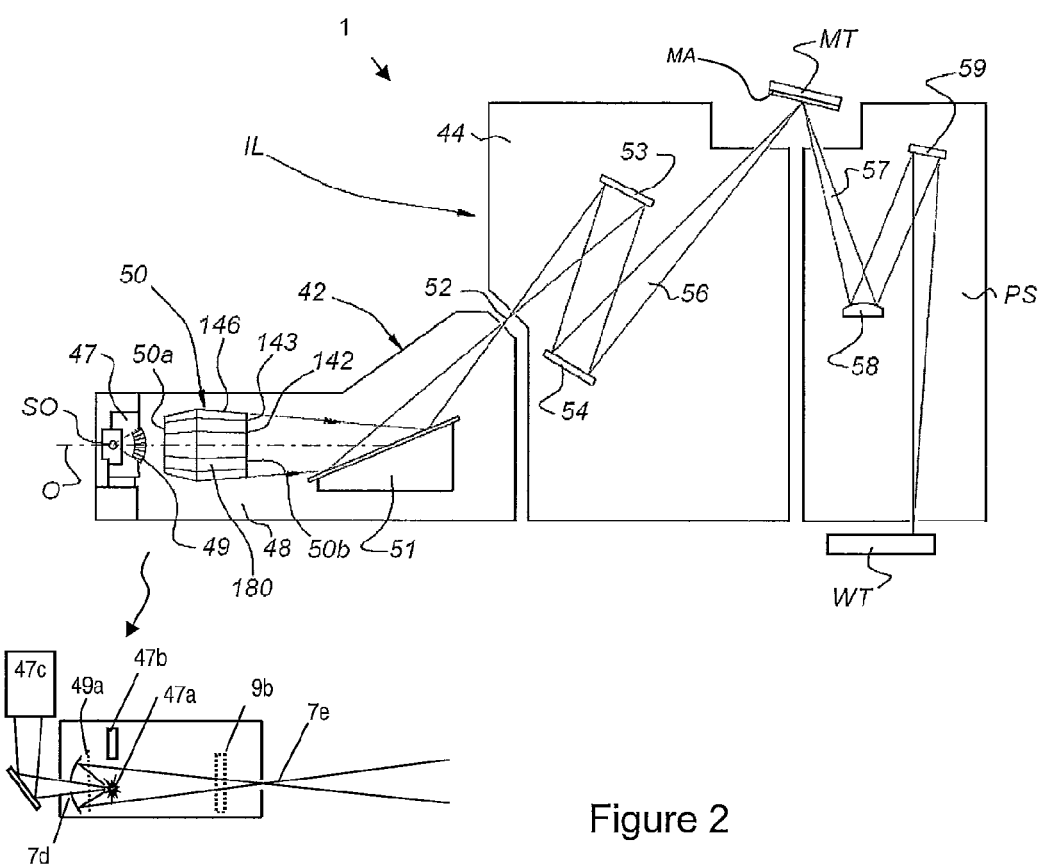
FIG. 2 schematically depicts a EUV lithographic projection apparatus.

FIG. 2 is a schematic side view of a practical EUV lithographic projection apparatus. It will be noted that, although the physical arrangement is different to that of the apparatus shown in FIG. 1, the principle of operation is similar. The apparatus includes a source-collector-module or radiation unit 42, an illumination system IL and a projection system PS. Radiation unit 42 is provided with a radiation source SO which may employ a gas or a vapor, such as for example Xe gas or a vapor of Li, Gd or Sn in which a very hot discharge plasma is created so as to emit radiation in the EUV range of the electromagnetic radiation spectrum. The discharge plasma is created by causing a partially ionized plasma of an electrical discharge to collapse onto the optical axis O. Partial pressures of, for example, 10 Pa of Xe, Li, Gd, Sn vapor or any other suitable gas or vapor may be required for efficient generation of the radiation. In an embodiment, a Sn source as EUV source is applied.

For this type of source, an example is the LPP source in which a $CO_2$ laser or other laser is directed and focused in a fuel ignition region. Some detail of this type of source is shown schematically in the lower left portion of the drawing. Ignition region 47a is supplied with plasma fuel, for example droplets of molten Sn, from a fuel delivery system 47b. The laser beam generator 47c may be a $CO_2$ laser having an infrared wavelength, for example 9.4 μm or 10.6 μm. Alternatively, other suitable lasers may be used, for example having respective wavelengths in the range of 1-11 μm. Upon interaction with the laser beam, the fuel droplets are transferred into plasma state which may emit, for example 6.7 nm radiation, or any other EUV radiation selected from the range 5-20 nm. The radiation generated in the plasma is gathered by an elliptical or other suitable collector 7d to generate the source radiation 7e.

The radiation emitted by radiation source SO is passed from the source chamber 47 into collector chamber 48 via a contaminant trap 49 in the form of a gas bather or "foil trap". This will be described further below. Collector chamber 48 may include a radiation collector 50 which is, for example, a grazing incidence collector comprising a nested array of so-called grazing incidence reflectors 142, 143 and 146 between which a certain space 180 is left open in order for radiation to pass through. Radiation collectors suitable for this purpose are known from the prior art. Alternatively, the apparatus can include a normal incidence collector for collecting the radiation. An example of such a normal incidence collector is collector 7d shown in the lower left portion of FIG. 2. The beam of EUV radiation emanating from the collector 50 will have a certain angular spread, perhaps as much as 10 degrees either side of optical axis O. Radiation is focused in a virtual point 52 (i.e. an intermediate focus) from an aperture in the collection chamber 48. From the chamber 48, the radiation beam 56 is reflected in illumination system IL via normal incidence reflectors 53, 54 onto a reticle or mask positioned on reticle or mask table MT. A patterned beam 57 is formed which is imaged by projection system PS via reflective elements 58, 59 onto wafer stage or substrate table WT. More elements than shown may generally be present in the illumination system IL and projection system PS.

As already mentioned in the introduction, it is convenient if the patterning device MA, e.g. a mask, can be operated without a pellicle. Therefore, the patterning device is likely to be subjected to organic and inorganic particle contaminations. These particles are preferably removed from the patterning device, because they can cause serious defects in the projected image at a wafer on the wafer table WT. Such particles may have a diameter as small as 20 nm.

Figure 3:
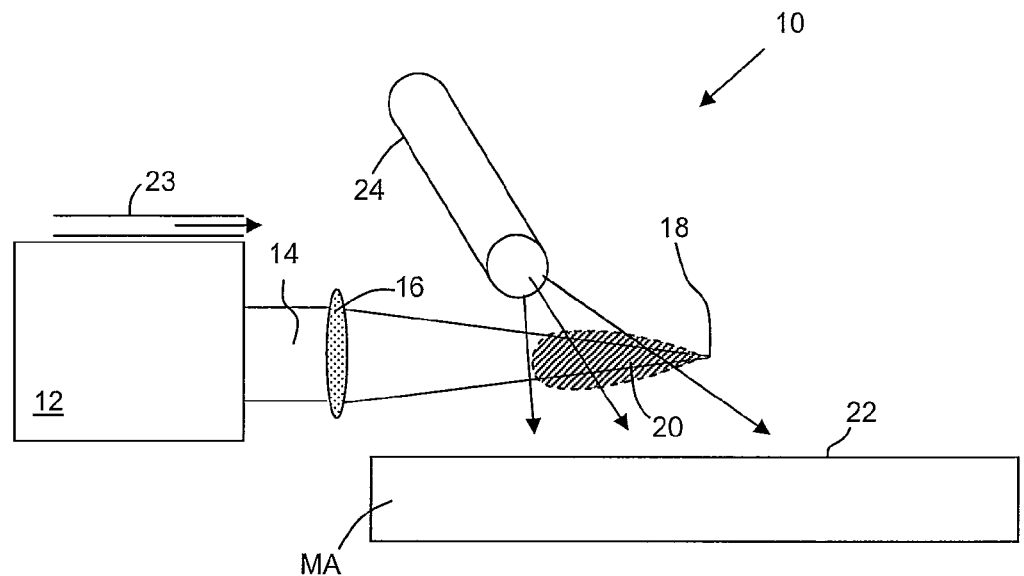
FIG. 3 is a schematic view of an embodiment of a laser cleaning device.

FIG. 3 is a schematic view of a laser cleaning device 10. The laser cleaning device 10 includes a laser source 12 which is constructed and arranged to generate radiation 14 which, as illustrated in FIG. 3, may have a direction substantially parallel to the substrate surface. The laser cleaning device 10 also includes a optical element, in FIG. 3 a lens 16, constructed and arranged to focus the radiation 14 in a focal point 18 in order to generate a cleaning plasma 20 in a background gas, such as nitrogen or air, above a surface 22 of the patterning device MA. A gas supply 23 is provided to generate the gas in which the plasma 20 is generated. A further gas supply 24 is provided to generate a jet of protection gas, e.g. argon, at a location near the plasma 20.

Typically, the laser source 12 is constructed and arranged to generate pulses in the focal point having an energy per pulse of between about 0.1 Joule and about 2 Joule which is generally considered a suitable range if the laser source is a neodymium-doped yttrium aluminium garnet (Nd:YAG) laser. An energy per pulse of higher than 0.001 Joule is generally considered suitable if a femtosecond laser is used as the laser source 12 instead. It will be apparent, however, that laser sources other than the examples mentioned above can be applied.

When a pulse of the radiation 14 is focused in the focal point 18, the plasma 20 is generated its expansion being biased towards the laser source 12. In order to avoid damage on the surface 22 of the patterning device MA, a sufficient amount of distance should be maintained between the surface 22 and the focal point 18 where the plasma 20 is generated.

Another way to avoid such damage is to provide a jet of protection gas, such as argon, at a location near the plasma 20. In the embodiment of FIG. 3, the jet is provided by the gas supply 24.

Argon is considered to be a suitable protection gas because it is easily ionized although chemically inert, is heavier than helium, and does not obstruct the shockwave, since it is a monoatomic gas. However, other gasses like nitrogen or air or mixtures thereof can be used instead or in addition to argon.

Figure 4A:
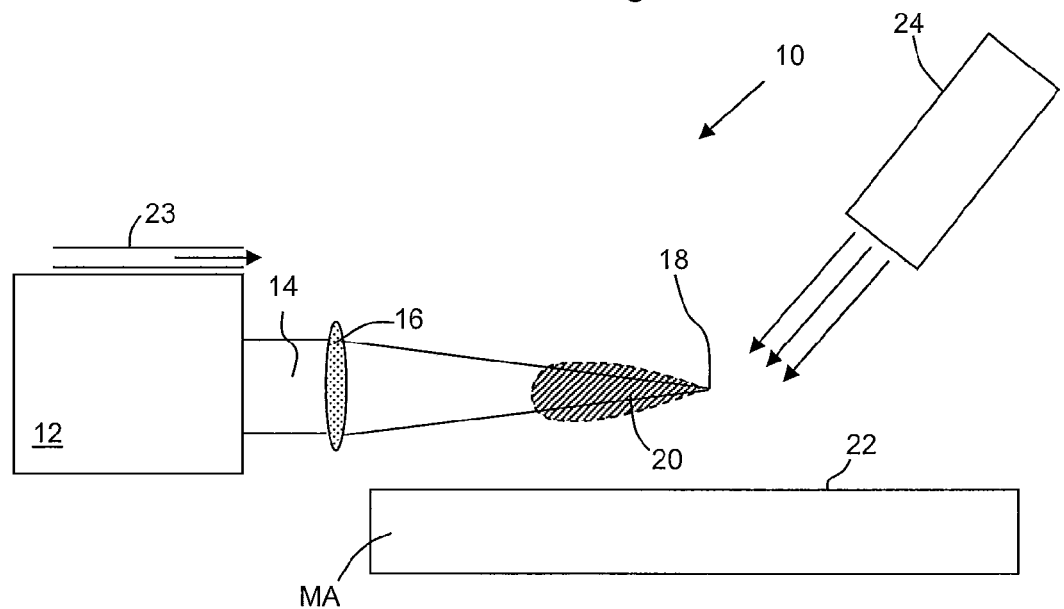
FIG. 4A is schematically depicts a side view and a top view of an embodiment of a laser cleaning device.
Figure 4B:
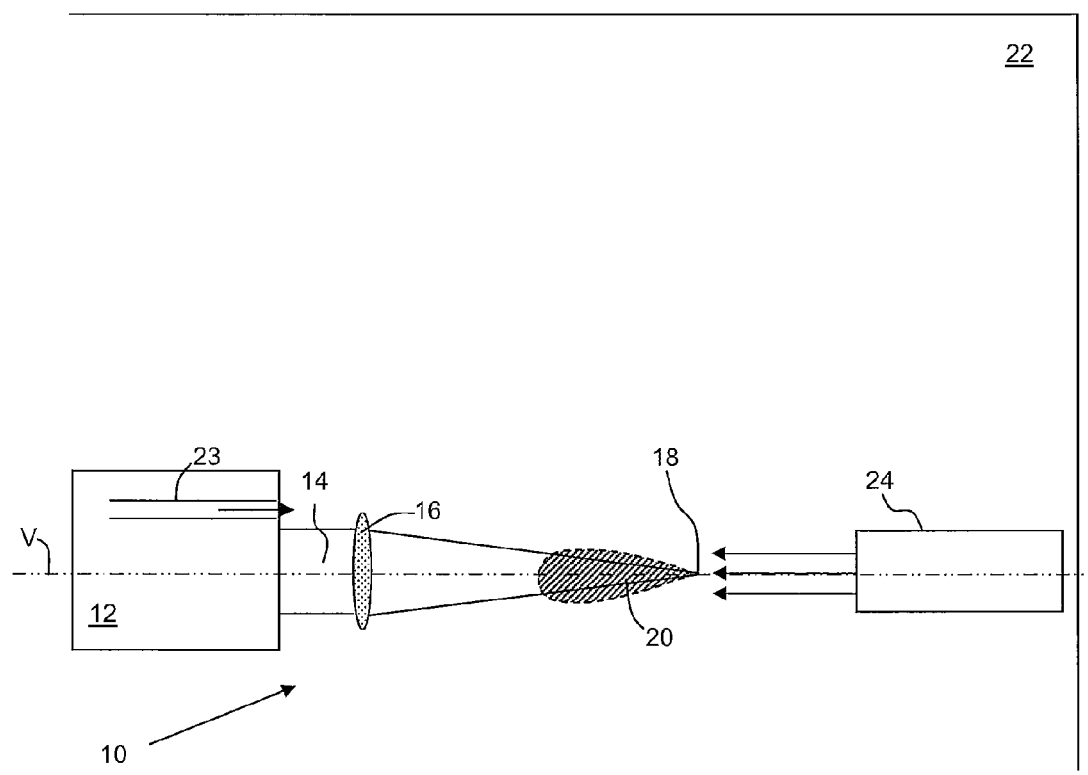
FIG. 4B is a top view of the laser cleaning device of FIG. 4A is depicted.

FIGS. 4A and 4B schematically show a side view and a top view of a further embodiment of the laser cleaning device. The embodiment of FIGS. 4A and 4B is quite similar to the embodiment disclosed referring to FIG. 3. In FIGS. 4A and 4B it is shown that in this embodiment, the direction of the jet of protection gas has a substantial component in a direction opposite to the direction of the radiation.

In FIG. 4A, it can also be seen that the gas supply 24 is arranged to direct the protection gas under an angle of about 45° with respect to a normal of the surface 22. Generally, although the jet of protection gas may prove to be effective from other angles, the protection gas has been found to be the most effective when the jet of protection gas is directed under an angle within the range of between about 30° and about 60° with respect to the normal of the surface 22.

In FIG. 4B a top view of the laser cleaning device of FIG. 4A is depicted. It can been seen in FIG. 4B that the gas supply is arranged to direct the protection gas in a direction substantially parallel to a plane V running through a normal of the surface 22 and is parallel to the radiation generated by the laser source.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the surface to be cleaned by the laser cleaning device may be a wafer surface or surface of a normal incidence or grazing incidence mirror.

Although a gas supply constructed and arranged to generate the background gas in which the plasma is generated, such a gas supply does not need to be present. A sufficient amount of air pressure may be present at the location of the plasma due to other factors rendering a specially designated gas supply redundant.

The invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications not mentioned above may be made to the invention as described without departing from the scope of the claims set out below.

What is claimed is:

1. A laser cleaning device constructed and arranged to clean a surface, the laser cleaning device comprising:
   a laser source constructed and arranged to generate radiation;
   a first gas supply constructed and arranged to generate a background gas;
   an optical element constructed and arranged to focus the radiation in a focal point above the surface in order to generate a cleaning plasma in the background gas above the surface; and
   a second gas supply constructed and arranged to separately generate a jet of protection gas at a location near the plasma to avoid damage to the surface, wherein the protection gas is provided in another direction, different from a direction of the radiation.

2. The laser cleaning device according to claim 1, wherein the laser source is constructed and arranged to generate pulses in the focal point having an energy per pulse of between about 0.001 Joule and about 2 Joule.

3. The laser cleaning device according to claim 2, wherein the laser source is constructed and arranged to generate pulses in the focal point having an energy per pulse of between about 0.1 Joule and about 2 Joule.

4. The laser cleaning device according to claim 1, wherein the laser source is arranged to generate the radiation in a direction at least substantially parallel to the surface such that the radiation does not impinge on the surface.

5. The laser cleaning device according to claim 1, wherein the second gas supply is constructed and arranged to direct the protection gas under an angle of between about 30° and about 60° with respect to a normal of the surface.

6. The laser cleaning device according to claim 5, wherein the second gas supply is constructed and arranged to direct the protection gas under an angle of about 45° with respect to the normal of the surface.

7. The laser cleaning device according to claim 1, wherein the second gas supply is arranged to direct the jet of protection gas in a direction substantially parallel to a plane that runs through a normal of the surface and is parallel the radiation generated by the laser source.

8. The laser cleaning device according to claim 7, wherein the direction of the jet of protection gas has a substantial component in a direction opposite to the direction of the radiation.

9. The laser cleaning device according to claim 1, wherein the protection gas is argon.

10. A lithographic projection apparatus comprising:
    a laser cleaning device constructed and arranged to clean a surface, the laser cleaning device comprising
    a laser source constructed and arranged to generate radiation;
    a first gas supply constructed and arranged to generate a background gas;
    an optical element constructed and arranged to focus the radiation in a focal point above the surface in order to generate a cleaning plasma in the background gas above the surface; and
    a second gas supply constructed and arranged to separately generate a jet of protection gas at a location near the plasma to avoid damage to the surface, wherein the protection gas is provided in another direction, different from a direction of the radiation.

11. The lithographic projection apparatus according to claim 10, further comprising a support structure constructed to hold a patterning device, the patterning device being capable of imparting a radiation beam with a pattern in its cross-section to form a patterned radiation beam, wherein the laser cleaning device is constructed and arranged to clean the patterning device.

12. The lithographic projection apparatus according to claim 10, further comprising a substrate table constructed to hold a substrate, wherein the laser cleaning device is constructed and arranged to clean the patterning device.

13. The laser cleaning device according to claim 10, wherein the protection gas is argon.

14. A method for cleaning a surface, the method comprising:
    generating radiation;
    generating a background gas with a first gas supply;

focusing the radiation in a focal point above the surface in order to generate a cleaning plasma in the background gas above the surface; and directing a jet of protection gas from a separate, second, gas supply to a location near the plasma to avoid damage to the surface, wherein the protection gas is provided in another direction, different from a direction of the radiation.

15. The method according to claim 14, wherein the radiation is pulsed.

16. The method according to claim 15, wherein the pulsed radiation contains pulses having an energy per pulse of between about 0.001 Joule and about 2 Joule.

17. The method according to claim 14, wherein the second gas supply is constructed and arranged to direct the protection gas under an angle of between about 30° and about 60° with respect to a normal of the surface.

18. The laser cleaning device according to claim 14, wherein the protection gas is argon.

* * * * *